United States Patent
Sekiya

(10) Patent No.: US 10,109,765 B2
(45) Date of Patent: Oct. 23, 2018

(54) LED ASSEMBLING METHOD

(71) Applicant: DISCO CORPORATION, Tokyo (JP)

(72) Inventor: Kazuma Sekiya, Tokyo (JP)

(73) Assignee: DISCO Corporation, Tokyo (JP)

(*) Notice: Subject to any disclaimer, the term of this patent is extended or adjusted under 35 U.S.C. 154(b) by 0 days.

(21) Appl. No.: 15/819,588

(22) Filed: Nov. 21, 2017

(65) Prior Publication Data

US 2018/0151773 A1    May 31, 2018

(30) Foreign Application Priority Data

Nov. 28, 2016 (JP) .................. 2016-230367

(51) Int. Cl.
| | |
|---|---|
| H01L 33/00 | (2010.01) |
| H01L 25/075 | (2006.01) |
| H01L 33/48 | (2010.01) |
| H01L 23/00 | (2006.01) |
| H01L 33/12 | (2010.01) |
| H01L 33/62 | (2010.01) |

(52) U.S. Cl.
CPC ...... H01L 33/0079 (2013.01); H01L 25/0753 (2013.01); H01L 33/48 (2013.01); *H01L 24/16* (2013.01); *H01L 33/0066* (2013.01); *H01L 33/12* (2013.01); *H01L 33/62* (2013.01); *H01L 2224/16145* (2013.01); *H01L 2933/0033* (2013.01)

(58) Field of Classification Search
CPC . H01L 33/0079; H01L 33/48; H01L 25/0753; H01L 33/0066; H01L 24/16; H01L 33/62; H01L 33/12; H01L 2933/0033; H01L 2224/16145
See application file for complete search history.

(56) References Cited

U.S. PATENT DOCUMENTS

| | | | |
|---|---|---|---|
| 8,541,287 B2 * | 9/2013 | Sekiya | H01L 33/0095 219/121.72 |
| 2012/0156858 A1 * | 6/2012 | Sekiya | B23K 26/0063 438/458 |

(Continued)

FOREIGN PATENT DOCUMENTS

| | | | | |
|---|---|---|---|---|
| JP | 10-305420 | 11/1998 | | |
| JP | 2002-314053 | 10/2002 | | |
| JP | 2002-314053 A | * 10/2002 | ............. | H01L 33/00 |

*Primary Examiner* — Charles Garber
*Assistant Examiner* — S. M. S Imtiaz
(74) *Attorney, Agent, or Firm* — Greer Burns & Crain Ltd.

(57) ABSTRACT

LED module chips are assembled by preparing red, green and blue LED substrates in regions partitioned at predetermined intervals. A module substrate has on its upper face a plurality of module chips each having an accommodation region for accommodating the red, green and blue LEDs therein. The front face of the LED substrate on which the LEDs are formed is opposed to the upper face of the module substrate. One of the LEDs is positioned to a predetermined one of the accommodation regions of the module chip, and a laser beam is irradiated from a rear face of the LED substrate to a buffer layer of LED with a condensing point of the laser beam positioned to the buffer layer to peel off the LED from an epitaxy substrate and accommodate the LED into the predetermined accommodation region of the module chip.

2 Claims, 7 Drawing Sheets

(56) References Cited

U.S. PATENT DOCUMENTS

2013/0240922 A1\* 9/2013 Yamamoto .......... H01L 25/0753
                                                    257/89
2016/0211245 A1\* 7/2016 Do ...................... H01L 25/0753
2018/0059429 A1\* 3/2018 Huber .................. H04N 13/332

\* cited by examiner

LED ASSEMBLING METHOD

BACKGROUND OF THE INVENTION

Field of the Invention

The present invention relates to a light emitting diode (LED) assembling method for integrating three different types of LEDs of red, green and blue to assemble a module chip on which the three different types of LEDs are mounted.

Description of the Related Art

A wafer is configured such that a plurality of LEDs configured from an epitaxial layer formed from a buffer layer, an N-type semiconductor layer, a light emitting layer and a P-type semiconductor layer, and electrodes disposed on the N-type semiconductor layer and the P-type semiconductor layer by epitaxial growth on an upper face of an epitaxy substrate such as a sapphire substrate or an SiC substrate are partitioned by scheduled division lines. The wafer is cut together with the epitaxy substrate along the scheduled division lines by a laser beam or the like to produce individual LEDs (refer to, for example, Japanese Patent Laid-Open No. 1998-305420).

Also a technology has been proposed for irradiating a laser beam from the rear face side of an epitaxy substrate to destroy a buffer layer, thereby peeling off an epitaxial layer from the epitaxy substrate (refer to, for example, Japanese Patent Laid-Open No. 2002-314053). Then, the peeled off LEDs are assembled into module chips in which a red LED, a green LED and a blue LED are integrated, and are used as a set of module chips in a monitor and so forth.

SUMMARY OF THE INVENTION

According to a conventionally known configuration, when red, green and blue LEDs described above are assembled into a module chip, it is necessary to execute such steps as to first peel off an epitaxial layer configuring LEDs from an epitaxy substrate, separating LEDs into separate individual LEDs, re-arranging the separated LEDs in a spaced relationship by a predetermined interval from each other on a substrate for temporarily holding the LEDs in order to mount the separated LEDs on a module and then assembling the LEDs re-arranged on the substrate into the module side and so forth. Therefore, much labor is required before individual modules on which the three different types of LEDs are mounted are obtained. Especially, in order to manufacture a monitor that adopts micro LEDs, a large number of module chips are required, and therefore, further improvement in efficiency of an LED assembling method for assembling LEDs into module chips is demanded. It is to be noted that the "micro LED" in the present invention signifies an LED having one side of a dimension on the μm order (smaller than 1000 μm).

Therefore, it is an object of the present invention to provide an LED assembling method by which three different kinds of LEDs of red, green and blue are integrated with a high efficiency.

In accordance with an aspect of the present invention, there is provided an LED assembling method for assembling module chips each including red, green and blue LEDs, including an LED substrate preparation step of preparing three different kinds of LED substrates in each of which an LED layer is stacked on an upper face of an epitaxy substrate with a buffer layer interposed therebetween and on a front face of each of which LEDs of one of red, green and blue are provided in regions partitioned with predetermined intervals, a module substrate preparation step of preparing a module substrate on an upper face of which a plurality of module chips each having an accommodation region for accommodating the red, green and blue LEDs therein are partitioned by scheduled division lines, a positioning step of positioning, while the front face of the LED substrate on which the LEDs of one of red, green and blue are formed is opposed to the upper face of the module substrate, one of the LEDs to a predetermined one of the accommodation regions of the module chip, and an LED accommodation step of irradiating a laser beam from a rear face of the LED substrate to the buffer layer of the LED positioned in the predetermined accommodation region of the module chip with a condensing point of the laser beam positioned to the buffer layer to peel off the LED from the epitaxy substrate and accommodate the LED into the predetermined accommodation region n of the module chip, in which the LED substrate preparation step prepares the LED substrates such that, on the front face of each of at least two ones of the three different kinds of LED substrates on the front face of each of which the LEDs of one of red, green and blue are provided, the LEDs are provided in a spaced relationship by a predetermined interval from each other such that, when an LED on the LED substrate is positioned to the accommodation region of the module chip at the LED accommodation step, the LED does not overlap with an LED accommodated already in the module chip.

Preferably, the LEDs are micro LEDs.

According to the LED assembling method of the present invention, a step of re-arranging on a substrate in order to accommodate a chip of an LED peeled off from an epitaxy substrate on which the LED is formed can be omitted, and it becomes possible to accommodate an LED chip from an epitaxy substrate directly into a module chip. Consequently, module chips can be manufactured efficiently.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

In the following, an LED assembling method according to the present invention is described in detail with reference to the accompanying drawings. First, when the LED assembling method of the present invention is carried out, an LED substrate preparation step is carried out at which an LED layer is stacked on an upper face of an epitaxy substrate with a buffer layer interposed therebetween and three different kinds of LED substrates each having LEDs of red, green or blue provided on the surface thereof are prepared in each of regions partitioned in a spaced relationship by a predetermined interval from each other, and a module substrate preparation step is carried out at which a module substrate on a front face of which a plurality of module chips each having accommodation regions for accommodating red, green and blue LEDs therein are partitioned by scheduled division lines and formed is prepared.

Figure 1A:
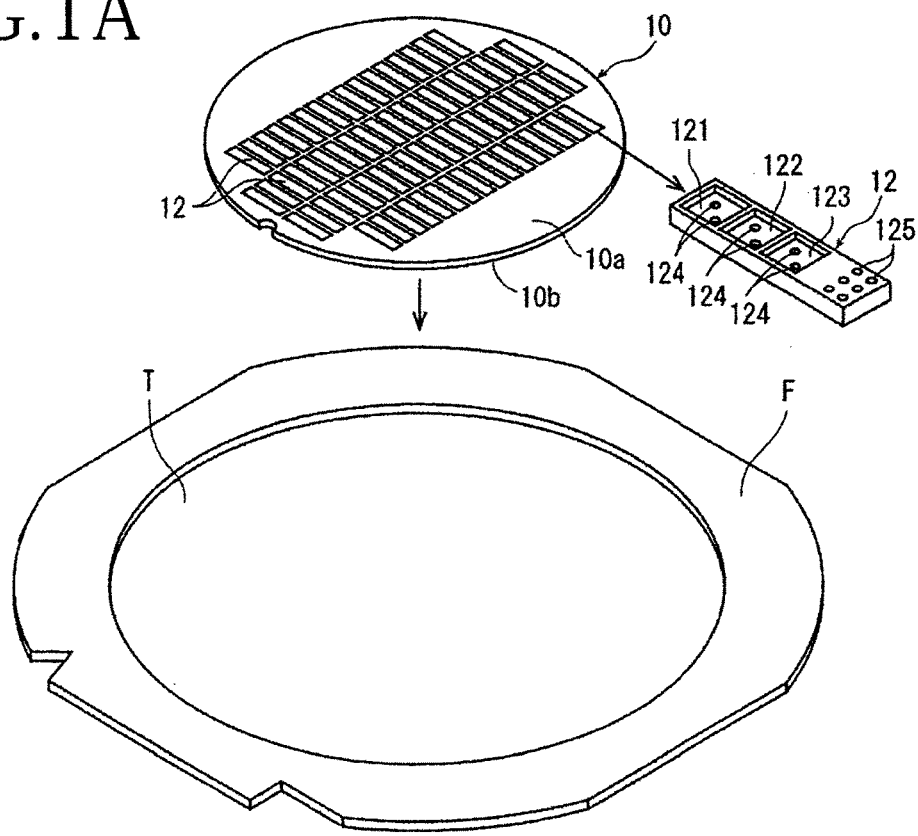
FIG. 1A is a perspective view illustrating a manner in which a module substrate is stuck to an adhesive tape whose outer peripheral portion is mounted on an annular frame.
Figure 1B:
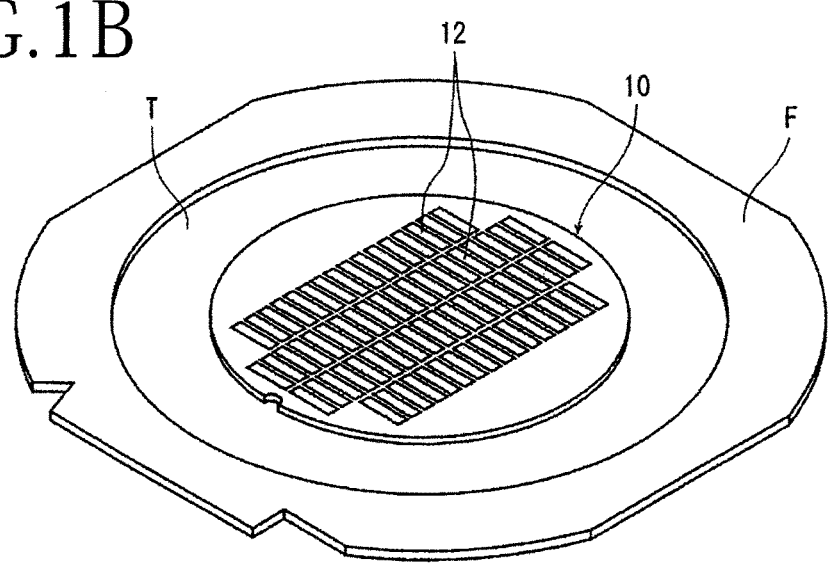
FIG. 1B is a perspective view of a state in which the module substrate is supported on the annular frame through the adhesive tape.

FIGS. 1A and 1B depict a module substrate 10 prepared by the module substrate preparation step, and the module substrate 10 has a substantially disk shape (FIG. 1A) and is stuck at a rear face 10b side thereof to an adhesive tape T and held on an annular frame F through the adhesive tape T (FIG. 1B). The module substrate 10 is formed with a diameter of 4 inches≈100 mm and has, on a front face 10a side thereof, regions partitioned in a grid pattern by scheduled division lines, and a module chip 12 having a rectangular shape as viewed in plan is formed in each of the regions. Part of the module substrate 10 is depicted in an enlarged scale in FIG. 1, and as depicted in the enlarged view of FIG. 1, each of the module chips 12 formed on the module substrate 10 includes at least an accommodation region 121 configured from a recessed portion having a rectangular opening for accommodating therein a red LED, another accommodation region 122 configured from a recessed portion having a rectangular opening for accommodating therein a green LED, and a further accommodation region 123 configured from a recessed portion having a rectangular opening for accommodating therein a blue LED, formed in a neighboring relationship with each other in a longitudinal direction thereof. At a bottom portion of each of the accommodation regions 121 to 123, two bumps 124 are disposed which are configured from gold (Au) and to which an anode electrode and a cathode electrode of an LED hereinafter described are connected when the LED is accommodated.

Six electrodes 125 are provided on an upper face of the module chip 12 neighboring in the longitudinal direction with the accommodation regions 121 to 123 and electrically connected to the bumps 124 disposed in the accommodation regions 121 to 123 such that electric power is supplied to the LEDs accommodated in the accommodation regions 121 to 123 from the electrodes 125 through the bumps 124. The module chip 12 is formed with such an outer profile that it is 40 μm long in the longitudinal direction and is approximately 10 μm long in the transverse direction as viewed in plan, and the opening of each accommodation region is formed in a square shape with one side of 9 μm. It is to be noted that the module chips 12 represented on the module substrate 10 of FIGS. 1A and 1B are indicated in a greater size than an actual size for the convenience of illustration, and actually, the module chips 12 have a size very much smaller than that illustrated in FIGS. 1A and 1B, and a greater number of module chips 12 are formed on the module substrate 10.

Figure 2A:
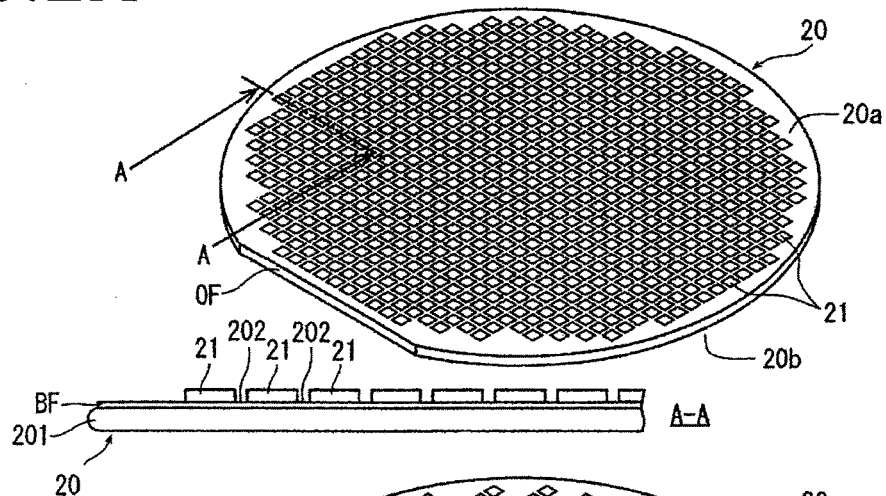
FIG. 2A is a perspective view of an LED substrate on which a plurality of red LEDs are to be formed.
Figure 2B:
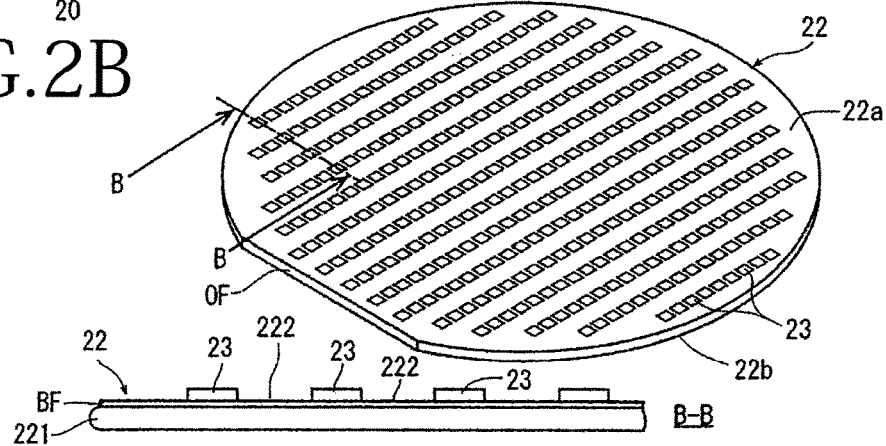
FIG. 2B is a perspective view of another LED substrate on which a plurality of green LEDs are to be formed.
Figure 2C:
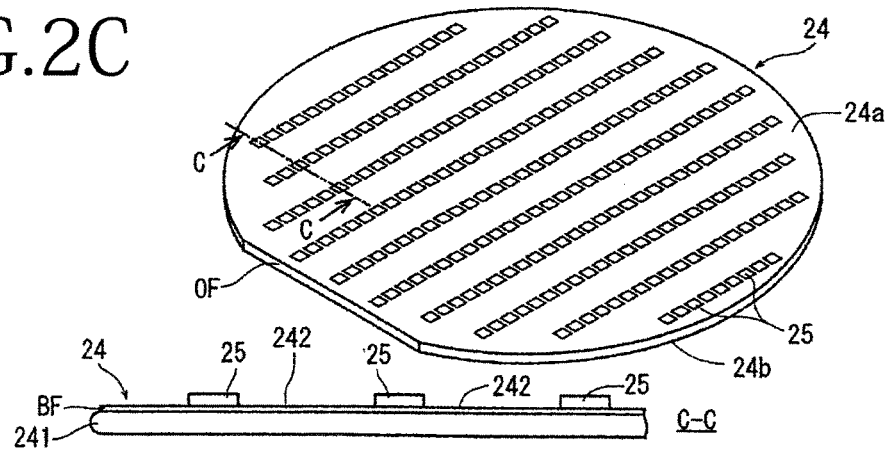
FIG. 2C is a perspective view of a further LED substrate on which a plurality of blue LEDs are to be formed.

FIGS. 2A to 2C depict an LED substrate 20 on which red LEDs 21 are formed, another LED substrate 22 on which green LEDs 23 are formed and a further LED substrate 24 on which blue LEDs 25 are formed, all prepared by an LED substrate preparation step in the present invention and depict partially enlarged sectional views taken along lines A-A, B-B and C-C. Each of the LED substrates 20, 22 and 24 substantially has a form of a disk as depicted in FIGS. 2A to 2C and is configured in a size substantially equal to that of the module substrate 10 (4 inches≈100 mm in diameter). The LED substrates 20, 22 and 24 have an LED layer formed on an upper face of epitaxy substrates 201, 221 and 241, each of which is configured from a sapphire substrate or an SiC substrate, through a buffer layer BF configured from a Ga compound (for example, gallium nitride: GaN). The LED layers configure the LEDs 21 that emit red light, the LEDs 23 that emit green light and the LEDs 25 that emit blue light (in the following description, the LEDs 21 are referred to as red LEDs 21; the LEDs 23 as green LEDs 23; and the LEDs 25 as blue LEDs 25). The red LEDs 21, the green LEDs 23 and the blue LEDs 25 are individually formed in a size of 8 μm×8 μm as viewed in plan and are each configured from an epitaxial layer configured from a N-type semiconductor layer, a light emitting layer and a P-type semiconductor layer, and electrodes configured from a P-type semiconductor and an N-type semiconductor and disposed on an upper face of the epitaxial layer (not depicted). On each of the LED substrates 20, 22 and 24, adjacent LEDs are formed such that they are partitioned in a spaced relationship by respective predetermined intervals 202, 222 and 242. Regions in which the predetermined intervals 202, 222 and 242 configuring gaps between the LEDs are formed, are masked when the LED layer is formed, and therefore, the buffer layer BF is exposed in the regions.

On an outer periphery of each of the LED substrates 20, 22 and 24, a linear portion, a so-called orientation flat OF, indicative of a crystal orientation is formed, and the red LEDs 21, the green LEDs 23 and the blue LEDs 25 formed on the upper face of the LED substrates 20, 22 and 24 are arrayed in a predetermined direction with reference to the crystal orientation. It is known that emission of red, green and blue light from the red LEDs 21, the green LEDs 23 and the blue LEDs 25 is obtained by changing the material configuring the light emitting layer, and, for example, for the red LEDs 21, aluminum gallium arsenide (AlGaAs) is used; for the green LEDs 23, gallium phosphide (GaP) is used; and for the blue LEDs 25, gallium nitride (GaN) is used. It is to be noted that the materials for configuring the red LEDs 21, the green LEDs 23 and the blue LEDs 25 in the present invention are not limited to them, and known materials for causing light of the individual colors to be emitted can be adopted. Also it is possible to use some other materials to emit light of the individual colors. Further, in the present embodiment, as depicted in FIGS. 2B and 2C, in the LED substrates 22 and 24 having the green LEDs 23 and the blue LEDs 25 provided on the surface thereof, the green LEDs 23 and the blue LEDs 25 are formed on the surface of the LED substrates 22 and 24 in a spaced relationship from each other by predetermined intervals, respectively, such that the green LEDs 23 and the blue LEDs 25 do not overlap with the red LEDs 21 accommodated formerly in the module chips 12 at an LED accommodation step hereinafter described. This is hereinafter described in detail.

Steps following the preparation step are described with reference to FIGS. 3A to 8B. After the LED substrate preparation step and the module substrate preparation step are carried out, a laser processing apparatus 40 depicted in FIG. 3 is used to carry out a positioning step for positioning the red LEDs 21, the green LEDs 23 and the blue LEDs 25 of the LED substrates 20, 22 and 24 to the predetermined accommodation regions 121 to 123 of the module chip 12, and an LED accommodation step of peeling off the LEDs from the epitaxy substrates 201, 221 and 241 and accommodating the LEDs into the predetermined accommodation regions 121 to 123 into which the red, green and blue LEDs of the module chips are to be accommodated.

The laser processing apparatus 40 is described with reference to FIG. 3. The laser processing apparatus 40 depicted in FIG. 3 includes a base 41, holding means 42 for holding the module substrate 10, moving means 43 for moving the holding means 42, laser beam irradiation means 44 for irradiating a laser beam, a frame member 45 extending upwardly from an upper face of the base 41 and then substantially horizontally and having the laser beam irradiation means 44 built therein, and control means (not depicted) configured from a computer hereinafter described, and is configured such that the means mentioned are controlled by the control means. Further, on a lower face of an end portion of the frame member 45 that extends horizontally, there are disposed a condenser 44a including an fθ lens and configuring the laser beam irradiation means 44, LED substrate holding means 50 juxtaposed in a direction indicated by an arrow mark X with respect to the condenser 44a and disposed adjacent the condenser 44a, and image pickup means 48 for picking up an image of a processing area of a workpiece.

Figure 3:
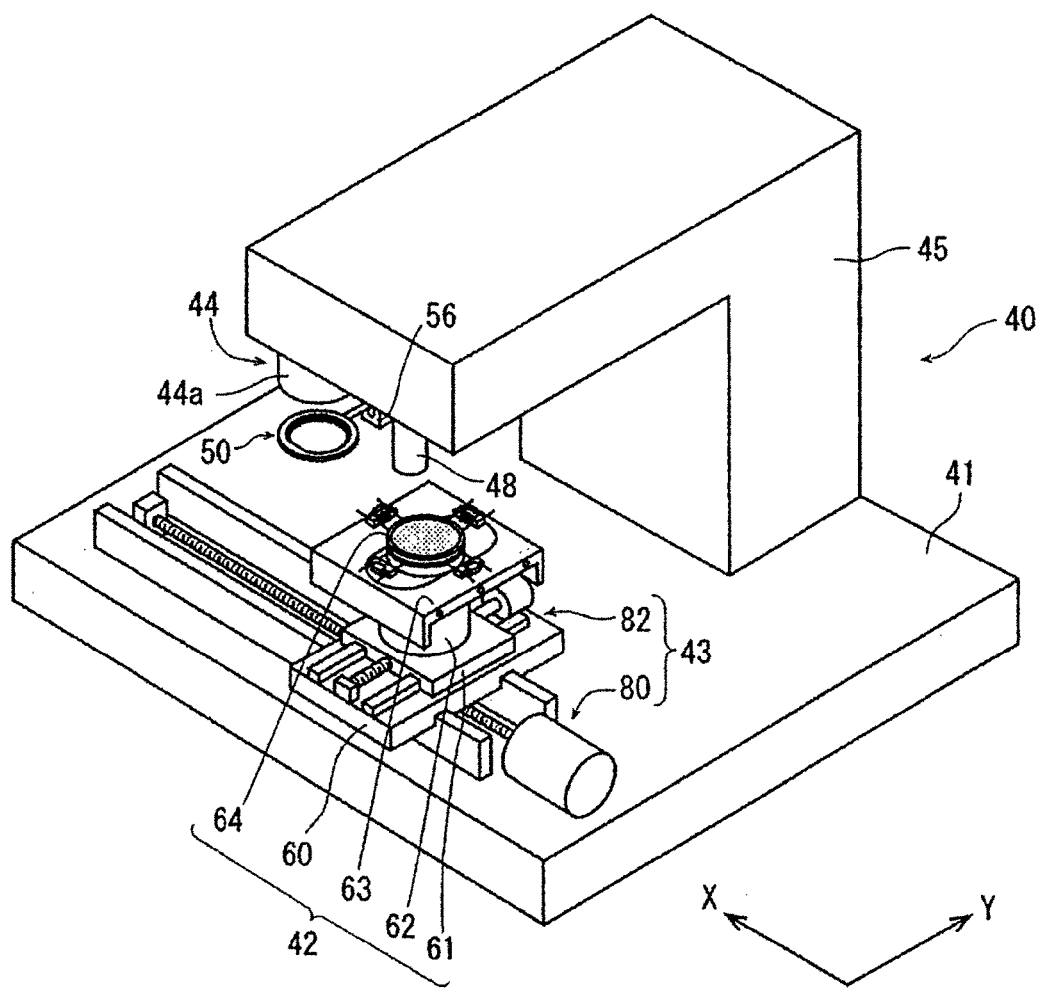
FIG. 3 is a perspective view of a laser processing apparatus.

The holding means 42 includes a rectangular X direction movable plate 60 mounted on the base 41 for movement in an X direction indicated by the arrow mark X in FIG. 3, a rectangular Y direction movable plate 61 mounted on the X direction movable plate 60 for movement in a Y direction indicated by an arrow mark Y in FIG. 3, a cylindrical support 62 fixed to an upper face of the Y direction movable plate 61, and a cover plate 63 of a rectangular shape fixed to an upper face of the support 62. On the cover plate 63, a holding table 64 for holding a circular workpiece is disposed which extends upwardly through an elongated hole formed on the cover plate 63. The workpiece is sucked to and held by a suction chuck connected to suction means not depicted that configures the upper face of the holding table 64. It is to be noted that the X direction in the present embodiment is a direction indicated by the arrow mark X in FIG. 3, and the Y direction is a direction indicated by the arrow mark Y in FIG. 3 and perpendicular to the X direction. A plane defined by the X direction and the Y direction is substantially horizontal.

The moving means 43 includes X direction moving means 80 and Y direction moving means 82. The X direction moving means 80 converts rotational motion of a motor into linear motion and transmits the linear motion to the X direction movable plate 60 such that the X direction movable plate 60 moves back and forth in the X direction along a guide rail on the base 41. The Y direction moving means 82 converts rotational motion of a motor into linear motion and transmits the linear motion to the Y direction movable plate 61 such that the Y direction movable plate 61 moves back and forth in the Y direction along a guide rail on the X direction movable plate 60. It is to be noted that, though not depicted, position detection means is disposed for each of the X direction moving means 80 and the Y direction moving means 82 such that the position in the X direction, the position in the Y direction and the rotational position in a circumferential direction of the holding table 64 are detected accurately. Consequently, the X direction moving means 80 and the Y direction moving means 82 are driven on the basis of signals indicated from control means hereinafter described such that the holding table 64 can be positioned accurately to an arbitrary position and angle.

The image pickup means 48 includes an optical system configuring a microscope and an image pickup element (charge-coupled device (CCD)) and sends a picked up image signal to the control means such that the image signal can be displayed on display means not depicted. It is to be noted that the control means is configured from a computer and includes a central processing unit (CPU) that performs an arithmetic operation process in accordance with a control program, a read only memory (ROM) that stores the control program and so forth therein, a readable/writable random access memory (RAM) for temporarily storing a detected detection value, a result of an arithmetic operation and so forth, and an input interface and an output interface (details are not depicted).

Figure 4A:
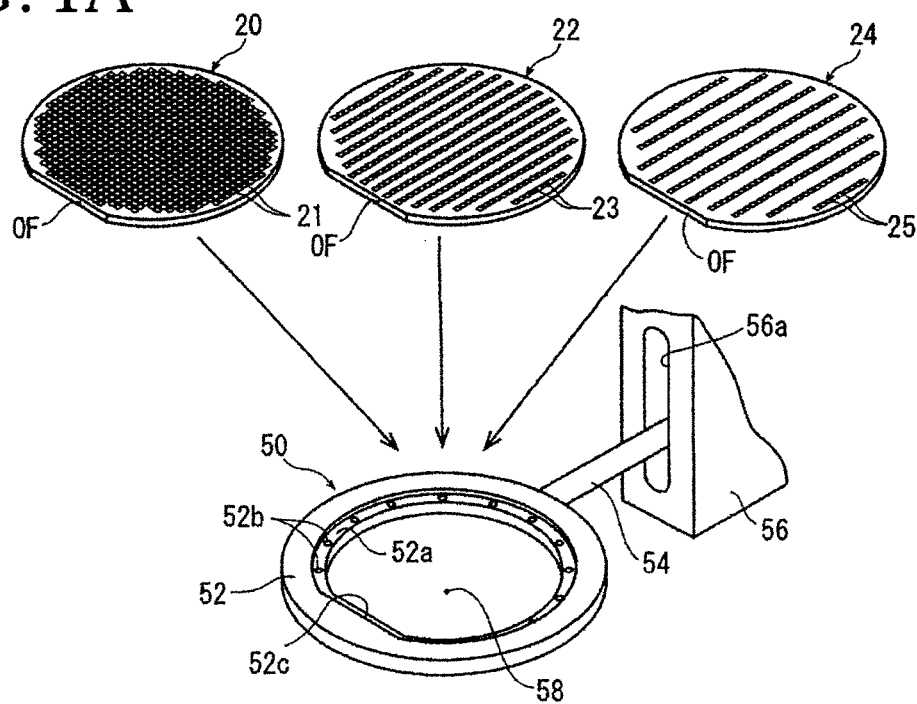
FIG. 4A is a perspective view illustrating a manner in which a plurality of LED substrates are mounted on LED substrate holding means.
Figure 4B:
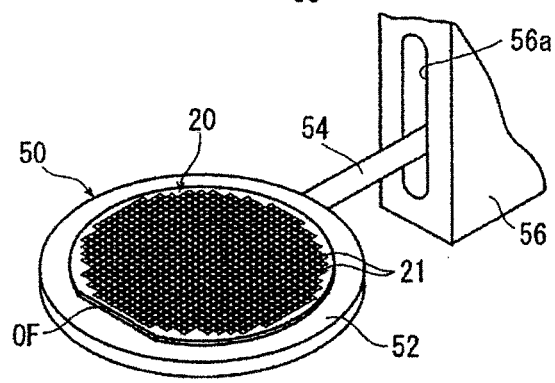
FIG. 4B is a perspective view of a state in which the plurality of LED substrates are held on the LED substrate holding means.

The LED substrate holding means 50 is described in detail with reference to FIGS. 4A to 4C. As depicted in FIG. 4A, the LED substrate holding means 50 is configured from a substrate holding ring 52 and a holding arm 54 that supports the substrate holding ring 52. The holding arm 54 is connected to driving means (not depicted) built in a holding base 56, which is disposed on a lower face of an end portion of the frame member 45 extending horizontally, through an opening hole 56a of the holding base 56. The substrate holding ring 52 has an annular opening 58 formed in accordance with a size of an LED substrate, and an annular stepped portion 52a on which an LED substrate is to be placed is disposed along the inner side of the substrate holding ring 52. On an upper face of the stepped portion 52a, a plurality of suction holes 52b for sucking and holding an LED substrate placed thereon are disposed in a predetermined spaced relationship from each other in a circumferential direction. When the LED substrate 20 is to be held, the LED substrate 20 is positioned with respect to the opening 58 and placed on the stepped portion 52a such that the front face 20a thereof is directed upwardly as depicted in FIG. 4B. Thereupon, by placing the LED substrate 20 such that the orientation flat OF of the LED substrate 20 is opposed to a linear portion 52c of the substrate holding ring 52, the direction of the LED substrate 20 held by the substrate holding ring 52 can be defined accurately. The suction holes 52b are connected to suction means not depicted through a suction path formed in the inside of the substrate holding ring 52 and the holding arm 54 such that they suck and hold the LED substrate 20 by rendering the suction means operative.

Figure 4C:
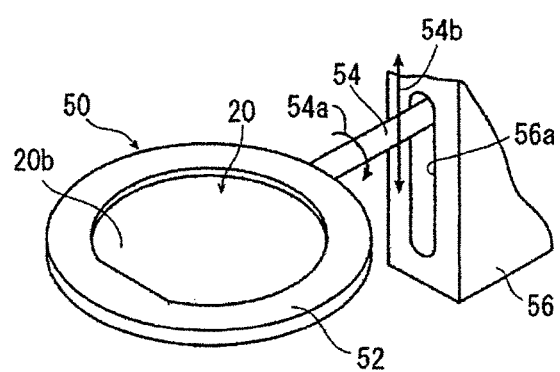
FIG. 4C is a perspective view illustrating a state in which the state illustrated in FIG. 4B is inverted by 180 degrees.

The substrate holding ring 52 on which the LED substrate 20 is held can rotate the holding arm 54 in a direction indicated by an arrow mark 54a in FIG. 4C by the driving means disposed on the holding base 56, and any of the front face 20a and a rear face 20b of the LED substrate 20 can be directed upwardly. Further, the substrate holding ring 52 is configured for movement in the upward and downward direction indicated by an arrow mark 54b in FIG. 4C by an instruction of the control means and can be controlled accurately to a desired heightwise position.

Figure 5:
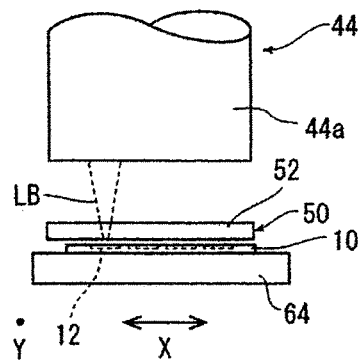
FIG. 5 is a side elevational view illustrating a configuration of a condenser, the LED substrate holding means and a holding table of the laser processing apparatus.

The condenser 44a of the laser beam irradiation means 44 depicted in an enlarged scale in FIG. 5 is configured from the fθ lens. Further, the irradiation position of a laser beam LB irradiated from the condenser 44a is adjusted by a laser oscillator disposed in the laser beam irradiation means 44, a reflection mirror for changing the direction of the laser beam oscillated from the laser oscillator, a galvano mirror for adjusting the irradiation direction of the laser beam reflected from the reflection mirror toward a predetermined position of the fθ lens of the condenser 44a, and so forth. By suitably controlling the direction of the galvano mirror, the laser beam LB can be irradiated upon a desired position of an LED substrate held on the substrate holding ring 52 positioned just below the condenser 44a, and the irradiation position can be controlled in the Y direction perpendicular to the plane on which FIG. 5 is depicted and the X direction indicative of the leftward and rightward direction of the plane of FIG. 5.

The laser processing apparatus 40 generally has such a configuration as described above, and the positioning step and the LED accommodation step at which the laser processing apparatus 40 is used are described further with reference to FIGS. 6A to 8B.

First, the moving means 43 is rendered operative to place the holding table 64 of the laser processing apparatus 40 depicted in FIG. 3 into a state in which the holding table 64 is moved to a substrate mounting position at this side of FIG. 3. After the holding table 64 is moved to the position depicted in FIG. 3, the module substrate 10 held by the frame F with the adhesive tape T interposed therebetween is placed on an upper face of the holding table 64 such that the front face 10a thereof is directed upwardly and the rear face 10b side thereof is directed downwardly, and the suction means not depicted is rendered operative to suck and hold the module substrate 10 to and on the holding table 64. After the module substrate 10 is sucked to and held on the holding table 64 and the frame F is fixed by a clamp mechanism or the like disposed on the outer periphery of the holding table 64, an image of the module substrate 10 sucked to and held on the holding table 64 is picked up using the image pickup means 48 described hereinabove, and alignment for positioning the condenser 44a of the laser beam irradiation means 44 and the position of the module substrate 10 relative to each other is executed. After the positioning of them is completed through execution of the alignment, the position of the substrate holding ring 52 in the upward and downward direction is controlled to move downwardly by an instruction of the control means not depicted, placing the LED substrate holding means 50 into a state depicted in FIG. 4A. Then, the LED substrate 20 on which the red LEDs 21 are formed is placed at the stepped portion 52a of the substrate holding ring 52. It is to be noted that, when the LED substrate 20 is to be held on the substrate holding ring 52, the orientation flat OF of the LED substrate 20 is placed in position with respect to the linear portion 52c of the substrate holding ring 52 as described hereinabove thereby to position the LED substrate 20 accurately in a desired direction with respect to the substrate holding ring 52 (refer to FIG. 4B).

After the LED substrate 20 is placed at the stepped portion 52a, the suction means not depicted is rendered operative to suck the LED substrate 20 through the suction holes 52b to place the LED substrate 20 into a sucked and held state. After the LED substrate 20 is sucked to and held by the substrate holding ring 52, the driving means for the holding base 56 is rendered operative to rotate the substrate holding ring 52 by 180 degrees in the direction of the arrow mark 54a as depicted in FIG. 4C to change the direction of the LED substrate 20 such that the rear face 20b side of the LED substrate 20 is exposed upwardly and the front face 20a on which the red LEDs 21 are formed is directed downwardly. After the LED substrate 20 is rotated in this manner, on the basis of the position information obtained by the execution of the alignment, the moving means 43 is rendered operative to position the holding table 64 just below the condenser 44a and the substrate holding ring 52 (refer to FIG. 5). Then, after the holding table 64 is moved to the position just below the substrate holding ring 52, the substrate holding ring 52 that has been moved to a position higher by a predetermined amount than the heightwise position of the holding table 64 is moved downwardly. At this time, due to the moving of the substrate holding ring 52 downwardly, as can be recognized from FIG. 6A that more particularly indicates the positional relationship of the LED substrate 20 and the module substrate 10 as viewed from sidewardly, by moving the LED substrate 20 toward the front face 10a of the module substrate 10, the accommodation region 121 of a module chip 12a is positioned closely just below a red LED 21a of the LED substrate 20. This is the positioning step in the present invention. It is to be noted that, in FIGS. 6A to 8B, the substrate holding ring 52 that holds the LED substrates 20, 22 and 24 is omitted for the convenience of illustration.

After the red LED 21a of the LED substrate 20 is positioned closely just above the accommodation region 121 of the module chip 12a by the positioning step, then the laser beam irradiation means 44 is rendered operative to carry out the accommodation step for accommodating the red LED 21a into the accommodation region 121. More particularly, the positions of the laser oscillator and the galvano mirror not depicted of the laser beam irradiation means 44 is controlled by an instruction from the control means to adjust the incidence position to the fθ lens, and the laser beam LB of a wavelength that has transparency with respect to the epitaxy substrate 201 but has absorbability with respect to the buffer layer BF (for example, 257 nm or 266 nm) is irradiated toward the buffer layer BF positioned on the rear face of the red LED 21a of a target from the rear face 20b side of the LED substrate 20. Consequently, the buffer layer BF is destroyed to form a gas layer along a boundary plane between the epitaxy substrate 201 and the red LED 21a, and the red LED 21a is peeled off from the epitaxy substrate 201.

The red LED 21a peeled off from the LED substrate 20 already is very close to the accommodation region 121 of the module chip 12a in a state before it is peeled off from the LED substrate 20, and is accommodated into the accommodation region 121 at a point of time at which the red LED 21a is peeled off. It is to be noted that the spot diameter of the laser beam LB is suitably adjustable. For example, if the spot diameter is such that the spot covers the overall area of the rear face side of the red LED 21a on which the buffer layer BF is formed (for example, 8 to 9 μm), then the red LED 21a can be peeled off by one time of irradiation of a pulsed laser beam, but where the laser beam is a pulsed laser beam of a spot diameter smaller than the spot diameter mentioned above (for example, 4 μm), if the incidence position of the laser beam to be incident to the fθ lens is changed to irradiate the pulsed laser beam by four times such that the buffer layer BF on the rear face of the red LED 21*a* is destroyed over an overall area thereof, then the red LED 21*a* can be peeled off.

Figure 6A:
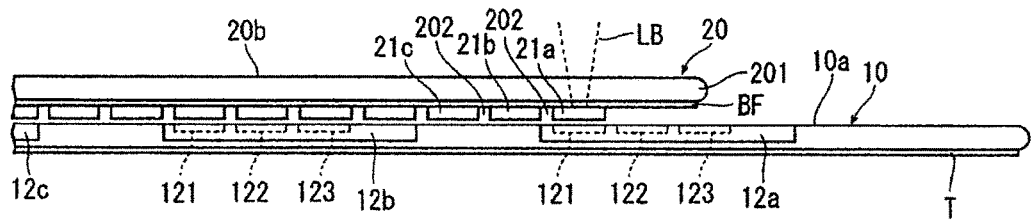
FIGS. 6A and 6B are side elevational views illustrating a step at which a red LED is accommodated into a module chip at an LED accommodation step.
Figure 6B:
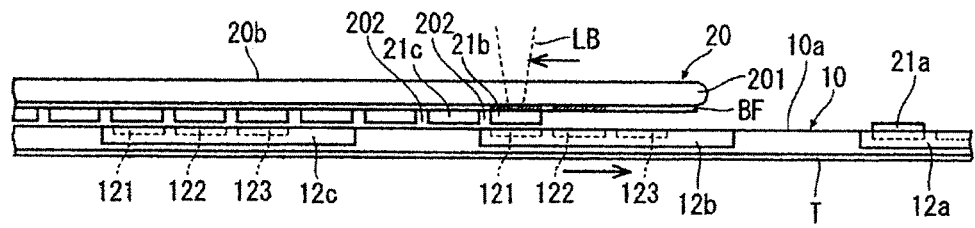

After the red LED 21*a* is peeled off from the LED substrate 20 and accommodated into the accommodation region 121 of the module chip 12*a*, the X direction moving means 80 of the laser processing apparatus 40 is rendered operative to move the module substrate 10 by a predetermined amount in a direction indicated by an arrow mark in FIG. 6B such that an accommodation region 121 of a next module chip 12*b* for accommodating a red LED 21*b* is positioned just below a next red LED 21*b* (positioning step). After the accommodation region 121 of the module chip 12*b* is positioned just below the red LED 21*b*, the direction of the galvano mirror of the laser beam irradiation means 44 is adjusted by an instruction from the control means to change the irradiation position of the laser beam LB, and the laser beam LB is irradiated upon the buffer layer BF positioned on the rear face of the red LED 21*b*. Consequently, the buffer layer BF positioned on the rear face of the red LED 21*b* is destroyed, and the red LED 21*b* is peeled off from the LED substrate 20 similarly to the red LED 21*a*, and the red LED 21*b* is accommodated into the accommodation region 121 of the module chip 12*b* (LED accommodation step).

By executing steps similar to the steps described above further, a next red LED 21*c* is accommodated into an accommodation region 121 of a module chip 12*c* formed adjacent the module chip 12*b*. After a red LED 21 is accommodated into all module chips 12 arrayed in the X direction in this manner, the module substrate 10 is index fed in the Y direction, and a red LED 21 on the LED substrate 20 is accommodated into the accommodation regions 121 of all module chips 12 arrayed in the X direction again. By repeating such a positioning step and an LED accommodation step as described above, a red LED 21 is accommodated into the accommodation regions 121 of all of the module chips 12 on the module substrate 10. As can be recognized by referring to the module chip 12*a* depicted in FIG. 6B, a red LED 21 accommodated in a module chip 12 indicates a state in which it projects upwardly from the surface of the module chip 12. It is to be noted that, when a red LED 21 is accommodated into an accommodation region 121 of each module chip 12, although the electrodes configured from a P-type semiconductor and an N-type semiconductor on the red LED 21 are brought into contact with the bumps 124 formed on the bottom of the accommodation region 121, they may be welded coupled by ultrasonic oscillation applied to the red LED 21 or may be coupled by conductive bonding material applied to end portions of the bumps 124 in advance.

After a red LED 21 is accommodated into all module chips 12 formed on the module substrate 10, a positioning step and an accommodation step for accommodating a green LED 23 into an accommodation region 122 of the module chip 12 are carried out. After a red LED 21 is accommodated into all module chips 12 as described above, the substrate holding ring 52 is moved up and the LED substrate 20 is removed from the substrate holding ring 52. Then, the LED substrate 22 on which the green LED 23 is disposed is held by the substrate holding ring 52 as depicted in FIG. 4A. Since the step of placing, sucking and holding the LED substrate 22 on, to and on the substrate holding ring 52 is quite same as that in the procedure for holding the LED substrate 20 described hereinabove, and therefore, details of the same are omitted here.

After the LED substrate 22 is sucked to and held by the substrate holding ring 52, the substrate holding ring 52 is rotated to change the direction thereof such that the rear face 22*b* side of the LED substrate 22 is exposed upwardly, namely, the front face 22*a* side is directed downwardly, in a similar manner as in the operation depicted in FIG. 4C. Then, the moving means 43 is rendered operative once again to position the module substrate 10 just below the LED substrate 22. Thereupon, the module substrate 10 is positioned, at the accommodation region 122 formed on the module chip 12*a* thereof, just below a predetermined green LED 23*a* of the LED substrate 22. Then, after the module substrate 10 is moved to the position just below the LED substrate 22, the substrate holding ring 52 having been moved to a position higher by a predetermined amount than the heightwise position of the holding table 64 is moved down until the LED substrate 22 comes close to the front face 10*a* of the module substrate 10 (positioning step).

Figure 7A:
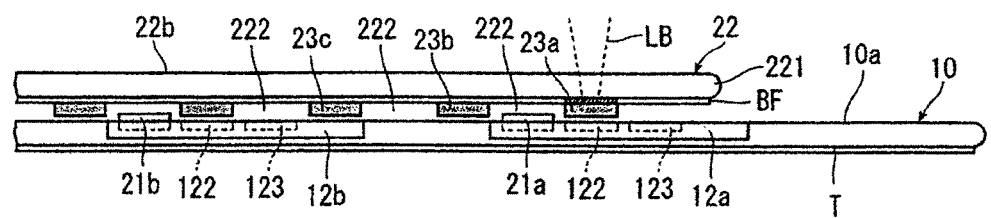
FIGS. 7A and 7B are side elevational views illustrating a step at which a green LED is accommodated into the module chip at the LED accommodation step.

Details of the LED substrate 22 in the present embodiment are described further. As can be recognized from the indication of the LED substrate 22 depicted in the FIGS. 7A and 7B, the green LEDs 23 disposed on the LED substrate 22 are disposed in a spaced relationship from each other by the predetermined interval 222, which is formed greater than the predetermined interval 202 of the red LEDs 21 disposed on the LED substrate 20 depicted in FIGS. 6A and 6B. Here, the predetermined interval 222 on the LED substrate 22 is set such that, when a green LED 23 of the LED substrate 22 is positioned closely so as to be accommodated into a module chip 12 as depicted in FIG. 7A, the green LED 23 does not overlap with the red LED 21 accommodated already in the module chip 12 as viewed in plan. Consequently, even if the LED substrate 22 is moved closer to the module substrate 10 in order to accommodate the green LED 23 into the module chip 12 as depicted in FIG. 7A, the green LED 23 does not overlap with the red LED 21 accommodated already in the module chip 12 and can be moved closer to a position suitable for accommodating the green LED 23 into the predetermined accommodation region 122.

Description is continued with reference to FIG. 7A. After the accommodation region 122 of a module chip 12*a* is positioned closely just below a green LED 23 of the LED substrate 22 by carrying out the positioning step described above, the laser beam irradiation means 44 is rendered operative to carry out an LED accommodation step for accommodating the green LED 23*a* into the accommodation region 122 similarly as at the LED accommodation step described hereinabove. In particular, a laser beam LB having a wavelength that has transparency with respect to the epitaxy substrate 221 but has absorbability with respect to the buffer layer BF is irradiated toward the buffer layer BF positioned on the rear face of the green LED 23*a* of a target from the rear face 22*b* side of the LED substrate 22. Consequently, the buffer layer BF is destroyed to form a gas layer along a boundary plane between the epitaxy substrate 221 and the green LED 23*a* thereby to peel off the green LED 23*a* from the epitaxy substrate 221. The green LED 23*a* peeled off from the LED substrate 22 is positioned very close to the accommodation region 122 of the module chip 12*a* already in a state before it is peeled off from the LED substrate 22 and is accommodated into the accommodation region 122 at a point of time at which it is peeled off.

Figure 7B:
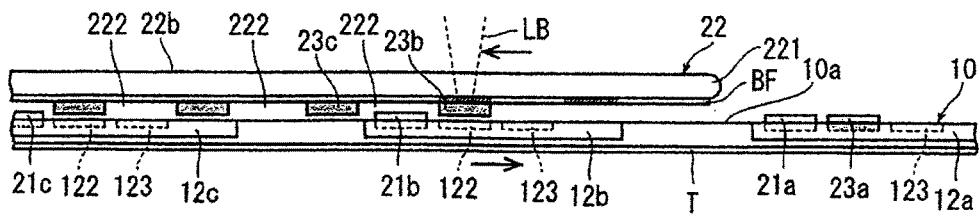

After the green LED 23*a* is accommodated into the accommodation region 122 of the module chip 12*a*, the moving means 43 is rendered operative to move the module substrate 10 by the predetermined distance in a direction indicated by an arrow mark depicted in FIG. 7B to position an accommodation region 122 of a next module chip 12*b* just below a next green LED 23*b* (positioning step). It is to be noted that, as can be recognized from FIG. 7B, in a state in which the LED substrate 22 is positioned close to the module substrate 10, since a lower end of the green LED 23 formed on the LED substrate 22 is positioned lower than an upper end of the red LED 21 accommodated already in the module chip 12, if the positional relationship remains as it is, then the module substrate 10 cannot be moved in the direction of the arrow mark in FIG. 7B. Therefore, when movement in the arrow mark direction by the moving means 43 is to be carried out, the driving means provided on the holding base 56 is rendered operative to move the substrate holding ring 52, by which the LED substrate 22 is held, upwardly once to move the module substrate 10 by a predetermined distance, whereafter the substrate holding ring 52 is moved downwardly again to carry out a movement thereof to move closer to the module substrate 10.

After the accommodation region 122 of the module chip 12*b* is positioned just below the green LED 23*b* as described above, the direction of the galvano mirror of the laser beam irradiation means 44 is adjusted by an instruction from the control means to change the irradiation position of the laser beam LB such that the laser beam LB is irradiated upon the buffer layer BF positioned on the rear face of the green LED 23*b*. Consequently, the buffer layer BF positioned on the rear face of the green LED 23*b* is destroyed to peel off the green LED 23*b* from the LED substrate 22 and the green LED 23*b* is accommodated into the accommodation region 122 of the module chip 12*b* (LED accommodation step). Then, similar steps are executed further to accommodate a next green LED 23*c* into an accommodation region 122 of a module chip 12*c* formed adjacent the module chip 12*b*. After a green LED 23 is accommodated into all module chips 12 arrayed in the X direction in this manner, the module substrate 10 is index fed in the Y direction to accommodate the green LEDs 23 on the LED substrate 22 into the accommodation regions 122 of all module chips 12 arrayed in the X direction again.

By repeating such a positioning step and an LED accommodation step as described above, a green LED 23 is accommodated into the accommodation regions 122 of all of the module chips 12 on the module substrate 10. It is to be noted that the green LEDs 23 formed on the LED substrate 22 are arrayed at great intervals in comparison with those in the case in which the red LEDs 21 are formed on the LED substrate 20, and the number of green LEDs 23 arrayed on the LED substrate 22 is approximately one second with respect to that on the LED substrate 20 on which the red LEDs 21 are disposed. Thus, approximately two LED substrates 22 are required for one LED substrate 20.

After a green LED 23 is accommodated into all of the module chips 12 formed on the module substrate 10, a positioning step and an LED accommodation step for accommodating a blue LED 25 into predetermined accommodation regions 123 of the module chips 12 are carried out subsequently. After the green LEDs 23 are peeled off from the LED substrate 22 and accommodated into all of the module chips 12 as described above, then the substrate holding ring 52 is moved upwardly to remove the LED substrate 22 from the substrate holding ring 52. Then, the LED substrate 24 on which the blue LEDs 25 are disposed is placed on the substrate holding ring 52 as depicted in FIG. 4A. Since the step for placing, sucking and holding the LED substrate 24 on, to and on the substrate holding ring 52 is quite same as that in the procedure for holding the LED substrates 20 and 22 described above, details of the step are omitted here.

After the LED substrate 24 is sucked to and held on the substrate holding ring 52, the substrate holding ring 52 is rotated to change the direction of the LED substrate 24 such that the rear face 24*b* side of the LED substrate 24 is exposed upwardly, namely, the front face 24*a* side on which the blue LEDs 25 are disposed is directed downwardly in a similar manner as in the operation depicted in FIG. 4C. Further, the moving means 43 is rendered operative to move the holding table 64 toward the substrate holding ring 52 side to position the module substrate 10 just below the LED substrate 24. Thereupon, the module substrate 10 is positioned, at an accommodation region 123 formed on the module chip 12*a* for accommodating a blue LED 25*a*, just below a predetermined blue LED 25*a* of the LED substrate 24. Then, after the module substrate 10 is moved to a position just below the LED substrate 24, the substrate holding ring 52 having been moved to a position higher by a predetermined amount than the heightwise position of the holding table 64 is moved downwardly to position the LED substrate 24 close to the front face 10*a* of the module substrate 10 (positioning step).

Figure 8A:
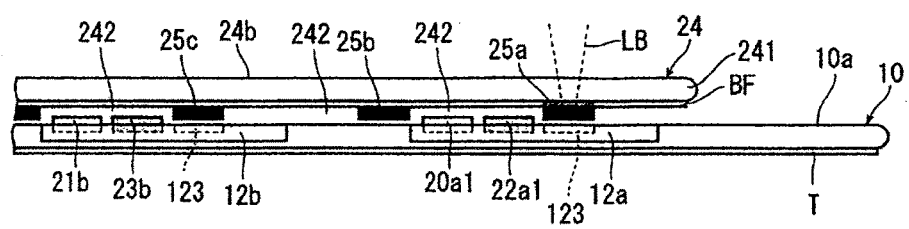
FIGS. 8A and 8B are side elevational views illustrating a step at which a blue LED is accommodated into the module chip at the LED accommodation step.

Details of the LED substrate 24 in the present embodiment are described further. As can be recognized from the illustration of the LED substrate 24 depicted in FIGS. 8A and 8B, the blue LEDs 25 disposed on the LED substrate 24 are disposed in a spaced relationship by the predetermined interval 242 from each other, and the interval is formed further greater than the predetermined interval 222 by which the green LEDs 23 disposed on the LED substrate 22 depicted in FIGS. 7A and 7B are spaced from each other. Here, the predetermined interval 242 on the LED substrate 24 is set such that, when a blue LED 25 of the LED substrate 24 is moved closer so as to be accommodated into a module chip 12, it does not overlap with a red LED 21 and a green LED 23 accommodated already in the module chip 12 as viewed in plan as depicted in FIG. 8A. Consequently, as depicted in FIG. 8A, even if the LED substrate 24 is moved to come close to the module substrate 10 in order to accommodate a blue LED 25 into a module chip 12, the blue LED 25 can be moved closer to a position suitable for accommodating the blue LED 25 into a predetermined accommodation region 123 without overlapping with any of a red LED 21 and a green LED 23 accommodated already in the module chip 12.

Description is continued with reference to FIG. 8A. After the positioning step is carried out to position the blue LED 25*a* of the LED substrate 24 so as to come close to the accommodation region 123 of the module chip 12*a*, the laser beam irradiation means 44 is rendered operative to accommodate the blue LED 25*a* into the accommodation region 123 in a similar manner as at the LED accommodation steps at which the red LED 21 and the green LED 23 are accommodated into the module chip 12*a*. In particular, a laser beam LB of such a wavelength that has transparency with respect to the epitaxy substrate 241 but has absorbability with respect to the buffer layer BF is irradiated toward the buffer layer BF positioned on the rear face of the blue LED 25*a* of a target from the rear face 24*b* side of the LED substrate 24. Consequently, the buffer layer BF is destroyed to form a gas layer along a boundary plane between the epitaxy substrate 241 and the blue LED 25*a* thereby to peel off the blue LED 25*a* from the epitaxy substrate 241. The blue LED 25*a* peeled off from the LED substrate 24 is positioned very close to the accommodation region 123 of the module chip 12*a* already in a state before it is peeled off from the LED substrate 24 and is accommodated into the accommodation region 123 at a point of time at which it is peeled off.

Figure 8B:
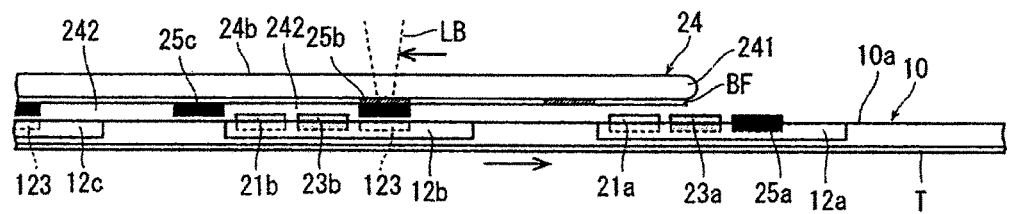

After the blue LED 25*a* is accommodated into the accommodation region 123 of the module chip 12*a*, the moving means 43 is rendered operative to move the module substrate 10 by a predetermined amount in a direction of an arrow mark depicted in FIG. 8B to position an accommodation region 123 of a next module chip 12*b* for accommodating a blue LED 25*b* just below a next blue LED 25*b* (positioning step). It is to be noted that, similarly as in the case in which the green LED 23 is accommodated into the module chip 12, in the state in which the LED substrate 24 is positioned close to the module substrate 10, a lower end of the blue LED 25 formed on the LED substrate 24 is positioned lower than an upper end of the red LED 21 and the green LED 23 both accommodated already in the module chip 12, if the positional relationship remains as it is, then the module substrate 10 cannot be moved in the direction of the arrow mark in FIG. 8B. Therefore, when movement in the arrow mark direction by the moving means 43 is to be carried out, the driving means not depicted provided on the holding base 56 is rendered operative to move the substrate holding ring 52, by which the LED substrate 24 is held, upwardly once to move the module substrate 10 by a predetermined distance, whereafter the substrate holding ring 52 is moved downwardly again to carry out a movement thereof to move closer to the module substrate 10.

After the accommodation region 123 of the next module chip 12*b* is positioned closely just below the next blue LED 25*b* in such a manner as described above, the direction of the galvano mirror of the laser beam irradiation means 44 is adjusted by an instruction from the control means to change the irradiation position of the laser beam LB such that the laser beam LB is irradiated upon the buffer layer BF positioned on the rear face of the blue LED 25*b*. Consequently, the buffer layer BF positioned on the rear face of the blue LED 25*b* is destroyed to peel off the blue LED 25*b* from the LED substrate 24 similarly to the blue LED 25*a*, and the blue LED 25*b* is accommodated into the accommodation region 123 of the module chip 12*b* (LED accommodation step). Then, similar positioning and LED accommodation steps are executed further to accommodate a next blue LED 25*c* into an accommodation region 123 of a module chip 12*c* formed adjacent the module chip 12*b*.

After a blue LED 25 is accommodated into all module chips 12 arrayed in the X direction in this manner, the module substrate 10 is index fed in the Y direction to accommodate the blue LEDs 25 on the LED substrate 24 into the accommodation regions 123 of all module chips 12 arrayed in the X direction again. By repeating such a positioning step and an LED accommodation step as described above, a blue LED 25 is accommodated into the accommodation regions 123 of all of the module chips 12 on the module substrate 10. It is to be noted that, as described above, the blue LEDs 25 formed on the LED substrate 24 are arrayed at further great intervals in comparison with those in the case in which the green LEDs 23 are formed on the LED substrate 22, and the number of blue LEDs 25 arrayed on the LED substrate 24 is approximately one third with respect to that on the LED substrate 20 on which the red LEDs 21 are disposed. Thus, approximately three LED substrates 24 are required for one LED substrate 20.

The red, green and blue LEDs are accommodated into all module chips 12 disposed on the module substrate 10 in such a manner as described above, and the LED assembling method of the present invention is completed therewith. It is to be noted that, after the LEDs are accommodated into all module chips 12 as described above, a separation step for separating the module chips 12 into individual chips may be carried out by a suitable method. The LED separation step is performed by adopting, for example, a suitable laser processing apparatus to irradiate a laser beam having a wavelength that has transparency with respect to the material of the module substrate 10 along a scheduled division line that partitions the module chip 12. Consequently, although the module chip 12 can be separated into individual chips, since the method for dividing the substrate by a laser processing apparatus is known, details of the same are omitted herein.

The present invention is not limited to the embodiment described above, but modifications can be assumed suitably without departing from the spirit and scope of the present invention. For example, the embodiment described above presents an example in which the LED substrates 20, 22 and 24 are formed such that the array interval of the red LEDs 21 is made smallest and the array interval increases to predetermined distances in order of the green LEDs 23 and the blue LEDs 25 such that the red LEDs 21 are accommodated into the module chips 12 using the LED substrate 20, whereafter the green LEDs 23 and the blue LEDs 25 are accommodated in order. However, the present invention is not limited to this, and the colors of the LEDs disposed on the LED substrates 20, 22 and 24 may be exchanged suitably.

Further, the predetermined intervals between the LEDs disposed on the LED substrates may be set suitably depending upon the size of the LEDs, the size of the module chips, the intervals between the module chips disposed on the module substrates and so forth. Thereupon, the LEDs are disposed at such predetermined intervals that, even if the LED substrates are positioned closer to the module chips, the LEDs to be accommodated newly do not overlap with the LEDs accommodated already.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. An LED assembling method for assembling module chips each including red, green and blue LEDs, comprising:
   an LED substrate preparation step of preparing three different kinds of LED substrates in each of which an LED layer is stacked on an upper face of an epitaxy substrate with a buffer layer interposed therebetween and on a front face of each of which LEDs of one of red, green and blue are provided in regions partitioned with predetermined intervals;
   a module substrate preparation step of preparing a module substrate on an upper face of which a plurality of module chips each having an accommodation region for accommodating the red, green and blue LEDs therein are partitioned by scheduled division lines;
   a positioning step of positioning, while the front face of the LED substrate on which the LEDs of one of red, green and blue are formed is opposed to the upper face of the module substrate, one of the LEDs to a predetermined one of the accommodation regions of the module chip; and
   an LED accommodation step of irradiating a laser beam from a rear face side of the LED substrate to the buffer layer of the LED positioned in the predetermined accommodation region of the module chip with a condensing point of the laser beam positioned to the buffer layer to peel off the LED from the epitaxy substrate and accommodate the LED into the predetermined accommodation region of the module chip,
wherein the LED substrate preparation step prepares the LED substrates such that, on the front face of each of at least two ones of the three different kinds of LED substrates on the front face of each of which the LEDs of one of red, green and blue are provided, the LEDs are provided in a spaced relationship by a predetermined interval from each other such that, when an LED on the LED substrate is positioned to the accommodation region of the module chip at the LED accommodation step, the LED does not overlap with an LED accommodated already in the module chip.

2. The LED assembling method according to claim 1, wherein the LEDs are micro LEDs.

* * * * *